United States Patent [19]

Porat

[11] Patent Number: 4,525,415
[45] Date of Patent: Jun. 25, 1985

[54] SINTERED HARD METAL PRODUCTS HAVING A MULTI-LAYER WEAR-RESISTANT COATING

[75] Inventor: Reuven Porat, Nahariya, Israel

[73] Assignee: Iscar Limited, North Nahariya, Israel

[21] Appl. No.: 415,784

[22] Filed: Sep. 8, 1982

[30] Foreign Application Priority Data

Sep. 11, 1981 [IL] Israel .................................. 63802

[51] Int. Cl.³ .................. B32B 7/02; B32B 15/04
[52] U.S. Cl. .................................. 428/216; 428/220; 428/336; 428/472; 428/698; 428/701
[58] Field of Search ............. 428/701, 220, 472, 216, 428/336, 698; 427/255

[56] References Cited

U.S. PATENT DOCUMENTS

| | | | |
|---|---|---|---|
| 3,837,896 | 9/1974 | Lindstrom et al. | 428/336 |
| 3,914,473 | 10/1975 | Hale | 427/255 |
| 3,977,061 | 8/1976 | Lindstrom et al. | 428/336 X |
| 4,237,184 | 12/1980 | Gonseth et al. | 428/472 X |

FOREIGN PATENT DOCUMENTS

| | | | |
|---|---|---|---|
| 3039775 | 4/1981 | Fed. Rep. of Germany | 428/216 |
| 2048960 | 12/1980 | United Kingdom | 428/216 |

OTHER PUBLICATIONS

Chemical Abstracts 91: 25770t, 11328m, Mar. 1979.
Chemical Abstracts 91: 161880e, May 1979.
Patent Abstracts of Japan, vol. 3, No. 49, (M-57) Apr. 1979 of JA-A-54/29185, Tokushu Togyo K.K.
Patent Abstracts of Japan, vol. 1, No. 157, Dec. 1977 of JA-A-52/100376, Mitsubishi Kinzoku KK.

Primary Examiner—Thomas J. Herbert
Attorney, Agent, or Firm—Ladas & Parry

[57] ABSTRACT

A sintered hard metal product, e.g. a disposable cutting insert for use in the machining of metals, consisting of a cemented metal carbide substrate and a thin wear-resistant surface coating comprising a plurality of coating layers of different compositions applied on to at least a part of the surface of said substrate and on top of each other by chemical vapor deposition, characterized in that said coating layers include:

an innermost layer applied directly onto said substrate and consisting of at least one member selected from carbides, nitrides and carbonitrides of Ti, Zr, Hf, V, Nb, Ta, Al and Si;

a second layer applied directly on said innermost layer, consisting essentially of aluminium oxide and having a thickness of about 1 to about 3$\mu$; and a third layer composed of one or more sublayers of titanium carbide, titanium nitride and titanium carbonitride, applied on top of said aluminium oxide layer. Said coating layers may further include an outermost layer consisting essentially of aluminium oxide and having a thickness of from about 0.4 to about 20 microns. Preferably, the total thickness of said surface coating is less than 20 microns.

6 Claims, 1 Drawing Figure

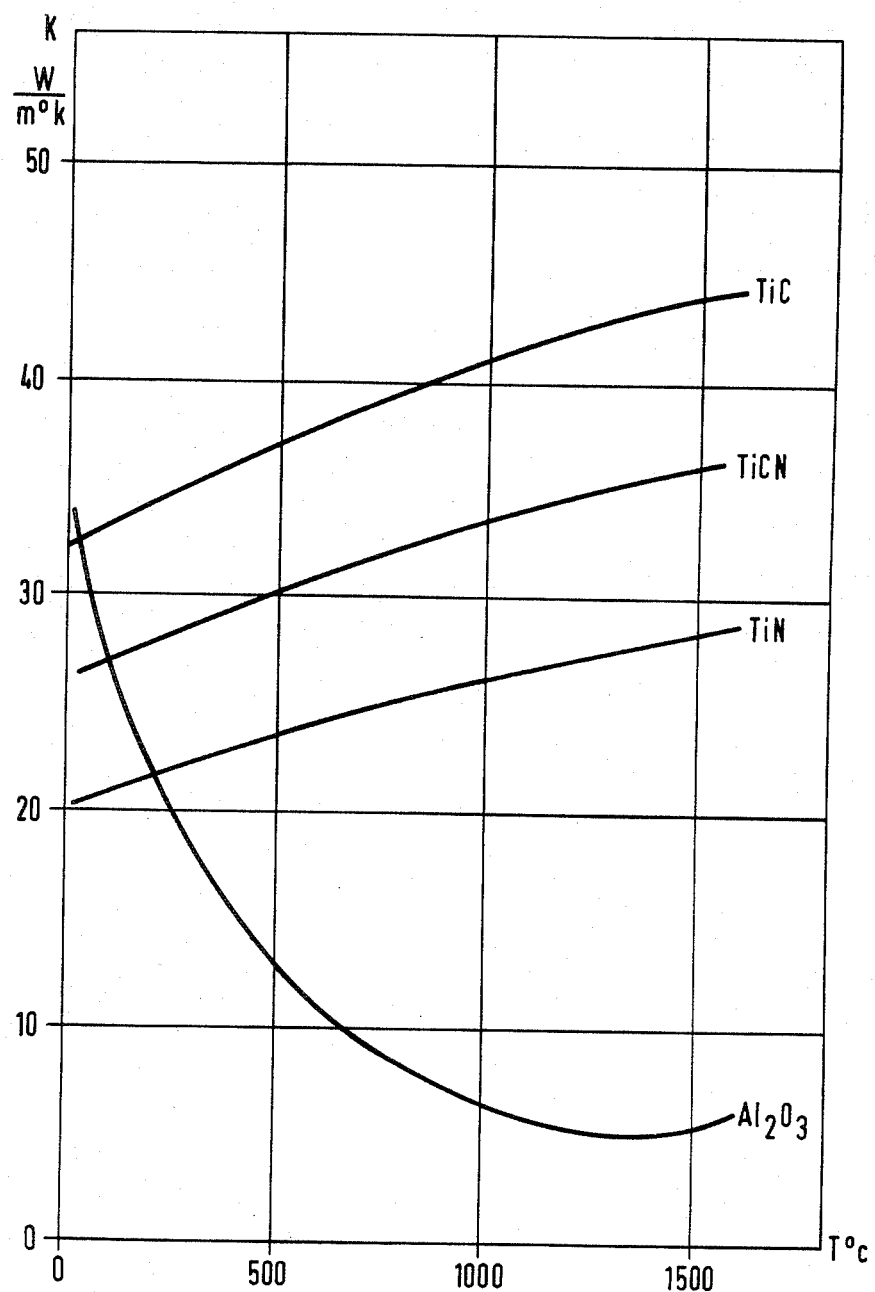

SINTERED HARD METAL PRODUCTS HAVING A MULTI-LAYER WEAR-RESISTANT COATING

This invention relates to sintered hard metal products coated with an improved surface coating and having both increased wear resistance and increased hardness and relatively high strength.

Sintered hard metals, also known as cemented carbides, consist of a mixture of one or more carbides of, mainly, tungsten, titanium, tantalum or niobium and a binder metal which in most cases is cobalt, but may also be nickel or a mixture of cobalt and nickel. Owing to their great surface hardness, wear resistance and strength, these sintered hard metals are extensively used for industrial applications in cutting tools and the like for machining of steel and other metals.

A considerable number of methods have been developed in recent years to enhance the wear-resistance and other desirable mechanical properties of hard metal products, such as cutting inserts, thus to lengthen their useful lifetime. Thus it is known to apply to hard metal products very thin surface coatings consisting of carbides, nitrides or carbonitrides of certain metals, especially titanium, and various combinations of such compounds. It is also known that further advantages can be obtained by using a coating consisting of two or more different layers of the abovementioned carbide and nitride compounds, the layers being applied one above the other.

It is also known to coat sintered metal products with very thin, wear-resistant ceramic coatings consisting principally of aluminium oxide, either as a single layer having a thickness of a few microns, or as an outer coating layer having a thickness of 0.2–20 microns over one or more inner layers of the conventional carbide, nitride or carbonitride coating compounds.

One of the major contributions of the coated sintered hard metal products resided in the fact that with coated inserts higher machining speeds could be attained which represented an important economical advantage seeing that the metal working machinery and therefore the machining time are comparatively expensive. Although industry now has available new machines capable of much higher speeds than the presently available coated tools can handle, the machining speeds of carbide tools are still limited because the high temperatures produced in the tool cause plastic deformation which, in turn, causes tool failure even before considerable wear of the tools occurs. The need thus exists for sintered hard metal cutting tools which are capable to withstand ever higher cutting speeds.

Practically all the above-described known coated hard metal products were designed mainly with the view to provide protection against the various types of wear and apparently hardly any account was taken of the fact that the coating also serves to insulate the tool itself against the high temperatures created during machining.

It has been observed (cf. A. Ber, SME Paper No. 72 WA, Prod. 24 (1972); M. Y. Friedman and E. Lenz, Wear 25 (1973) and M. Y. Friedman and E. Lenz, CIRP Vol. XVIV (1979)), that tools with low thermal conductivity succeed at higher machining speeds and exhibit lower crater wear and less force on the tool. Tools with lower thermal conductivity also change the chip-forming process, decrease the contact length between chip and tool and cause a transfer of the heat created from the tool to the chip-shearing zone with the result that when a certain machining speed is reached, temperatures of the tool decrease and become stable at a machining speed of about 300 m/min. It has also been shown (E. Lenz, O. Pnuelli and L. Rozeana, Wear 53 (1979)) that cutting tools coated with layers thicker than about $1\mu$ of materials of low heat conductivity behave, as regards their cutting performance, as if the entire tool were made of the material of the coating of low heat conductivity.

Notwithstanding the above findings, it has not apparently been hitherto realised that in order that coated sintered carbide tools should be suitable for use at high machining temperatures, it is essential that they be designed so as to provide thermal insulation between the substrate and the workpiece, thus to avoid plastic failure of the tool.

It is thus the object of the present invention to provide coated sintered hard metal products wherein the coatings are specifically designed so as to enable the coated products to be used at very high machining speeds while maintaining excellent wear resistance against all wear mechanisms, on the one hand, without losing the advantages of the high strength of the sintered hard metal tool materials, on the other hand.

The above object is achieved in accordance with the present invention by providing a sintered hard metal product consisting of a cemented metal carbide substrate and a thin wear-resistant surface coating comprising a plurality of coating layers of different compositions applied one on top of the other by chemical vapour deposition, characterized in that said coating layers include:

(1) An innermost layer bonded directly to said substrate and consisting of at least one member selected from carbides, nitrides and carbonitrites of Ti, Zr, Hf, V, Nb, Ta, Al and Si;

(2) a second layer applied directly on said innermost layer, consisting essentially of aluminium oxide and having a thickness of about 1 to about $3\mu$;

(3) a third layer composed of one or more sublayers of titanium carbide, titanium nitride and titanium carbonitride, applied on top of said aluminium oxide layer; and, optionally, (4) an outermost layer consisting essentially of aluminium oxide and having a thickness of from about 0.4 to about 20 microns.

The total thickness of the coating in accordance with the invention preferably should not exceed about 20 microns.

In accordance with the invention it has been found that sintered hard metal products provided with a multi-layer coating as specified above, are superior to the hitherto available sintered hard metal products in respect of their machining performance, particularly at very high temperatures and consequently can be used at hitherto unattainable machining speeds which cause tool failure, through plastic deformation, of any conventional sintered carbide tool.

The coated sintered hard metal products according to the present invention are distinguished from the prior art coated products mainly in the presence of the above specified second coating layer consisting of aluminium oxide. The task assigned to this layer in accordance with the present invention is not merely to serve as a wear-resistance coating but principally as a heat barrier of low thermal conductivity adapted to insulate the substrate from the very high temperatures arising in the working zone, thereby achieving the above described advantages. The invention herein utilizes the rather unique thermal behaviour of aluminium oxide, the thermal conductivity of which decreases with an increase in temperature, as contrasted to the other compounds (e.g. TiC, TiCN ad TiN) conventionally used for coating sintered carbide products. Reference is made in this connection to the accompanying drawing which is a diagram showing the thermal conductivity of the aforesaid materials as a function of temperature. By virtue of this property of aluminium oxide, the advantages of the aforesaid second coating layer in accordance with the invention become more and more pronounced as the temperature of the tool increases or, in other words, at higher and higher machining speeds. At these higher speeds the aluminium oxide layer, because of its poor heat conductivity acts as an excellent heat insulator and keeps comparatively low temperature conditions in the tool substrate, thus protecting the mechanical properties of the tool at high machining speeds.

The above applies also to the optional, outermost aluminium oxide layer in the coating according to a preferred embodiment of the invention. This outermost layer has the two-fold task of acting both as a thermal and wear barrier.

The innermost coating layer in accordance with the invention, i.e. the first layer which is directly bonded to the substrate, in the cases where it consists of titanium nitride, may also serve as a secondary thermal insulating barrier in view of the fact, that as can be seen from the attached drawing, the thermal conductivity of titanium nitride is considerably lower than that of titanium carbide or titanium carbonitride at all temperatures. However, this property of an innermost titanium nitride layer is more pronounced at lower temperatures when the thermal conductivity of this material is lowest.

The main function, however, of the first, innermost coating layer according to the present invention is to permit the growing thereon, by chemical vapour deposition, of the second aluminium oxide layer in a uniform and controlled manner so as to provide a homogeneous and fine-grained aluminium oxide layer having strong adherence to the underlying body of the sintered metal substitute. It has been found that this result can be advantageously achieved by the preliminary, so to say, "passivation" of the sintered carbide substrate, which passivation consists in first depositing on the substrate a comparatively thin layer of a material selected from nitrides, carbides and carbonitrides of Ti, Zr, Hf, V, Nb, Ta, Al and Si. Among these possible materials for forming the "passivating layer", titanium nitride is sometimes preferred, owing to its low thermal conductivity at elevated temperatures, as explained above. Another suitable material is aluminium nitride.

The various coating layers in accordance with the invention are applied consecutively on the surface of the substrate and on each other, respectively, by the well known chemical vapour deposition techniques, such as described, e.g. in U.S. Pat. Nos. 3,836,392; 3,914,473; 3,977,061; 3,837,896; 4,035,541 and 4,052,530. The various parameters of this process of chemical vapour deposition are selected in each step of the coating procedure so as to obtain with the individual layers according to the invention at the desired composition, consistency and thickness. The choice of either parameters is particularly important for the deposition of the second aluminium oxide layer and also of the outermost aluminium oxide layer, if present in accordance with the preferred embodiment of the invention, in order to obtain these aluminium oxide layers in a dense, uniform and fine crystalline structure. Aluminium oxide layers having these desired properties can be obtained by deposition from the gaseous phase in a furnace heated to a temperature in the range of from 700° to 1200° C., preferably from 927° to 1127° C. It has been found that the pressure at which the chemical vapour deposition is carried out is quite critical for the quality and structure of the deposited aluminium oxide layer. The required dense and thin layer can be obtained, as controlled thicknesses, by deposition under reduced pressure and it has been found that the lower the pressure, the slower is the rate of deposition and the denser the structure of the obtained layer. Thus, for the formation of the aluminium layer the preferred pressure range inside the furnace is from 10 to 100 torr. Against this, pressures of from 20 to 200 torr can be used when depositing the outermost aluminium oxide layer, in accordance with the preferred embodiment of the invention. It has further been found that if the chemical vapour deposition of the aluminium oxide layer is carried out at pressures higher than about 200 torr, the layers obtained are porous and have a less dense structure. This dense aluminium oxide layer has a further advantage in that it ensures the deposition thereupon of the subsequent outer layers in a similar dense, fine-crystalline structure.

As regards the specific nature of the third coating layer according to the invention, i.e. the layer applied directly on top of the second aluminium oxide layer and, where this third layer is composed of a plurality of coating layers, as regards the number and sequence of these sub-layers, the present invention allows for, and is meant to include a considerable number of variations and combinations, each imparting to the coated product a specific set of desired physical properties and wear-resistance characteristics. In accordance with one preferred embodiment of the invention, said third layer is composed of three sub-layers in the following sequence, starting from the second alumina layer outwards: Tin—TiCN—TiC.

As mentioned above, the coatings in accordance with the preferred embodiments of the invention comprise, an outermost wear-resistant surface coating layer composed essentially of aluminium oxide and having a thickness of from about 0.4 to about 20 microns. As explained above, such an outermost aluminium oxide layer may serve as a heat insulating barrier, auxiliary to said second aluminium oxide layer which is an essential feature of all the coating combinations according to this invention. In addition, such an outermost aluminium oxide layer provides all those advantages hitherto reported in respect of known ceramic-coated hard metal products, namely: high wear resistance at high temperatures owing to the stability of the aluminium oxide at such high temperatures, inhibition of oxidation and lesser decrease of hardness with increasing temperatures (so-called "hot-hardness") as compared to other coating materials. The use of such an outer aluminium oxide coating layer affords protection against abrasive wear even at high temperatures and the structural stability of the aluminium oxide even at high temperatures, additionally prevents the adhesive wear which is due to removal of material particles from the coating. Furthermore, the presence of an outermost layer of aluminium oxide in the coating, prevents crater formation in tools adapted for machining, because this outer layer serves as a barrier between the tool and the chip, preventing loss by diffusional wear of carbon atoms from the coating and the substrate to the chip, which mechanism usually causes accelerated crater wear.

BRIEF DESCRIPTION OF THE DRAWING

The drawing shows the thermal conductivity of titanium carbide, titanium carbonitride, titanium nitride and aluminum oxide as a function of temperature.

The invention will now be illustrated in more detail by the following non-limiting examples:

EXAMPLE 1

Sintered carbide cutting inserts suitable for the ISO M15 application range (according to the International ISO Classification) were chosen for the coating tests. The carbide substrate had the following composition and mechanical properties:

| Composition in %/Volume for carbide ISO M15: | |
|---|---|
| 11% Co + 9% TiC + 7% (TaC + NbC) + 73% WC | |
| Mechanical properties: | |
| Transverse rupture strength | TRS = 2100 $\frac{N}{mm^2}$ |
| Hardness | 92.0 $R_A$ |
| Elastic module | E = 570 $\frac{kN}{mm^2}$ |
| Thermal conductivity at 673K | K = 60 $\frac{W}{mK}$ |
| Thermal expansion coefficient from 20–800° C. | $\alpha_t = 6.3 \times 10^{-6}$ |

The sintered hard metal cutting inserts of the type described above (such as inserts TNMG 432 and TNMA 432) were placed in a furnace provided with a gas inlet and a gas outlet system connected to a vacuum pump. The furnace was heated to 1027° C. and fed, consecutively, with the various gas mixtures under different pressure and rate of flow conditions as follows:

| Step A: Composition of gaseous mixture by volume: | |
|---|---|
| Hydrogen | 70% |
| Titanium tetrachloride (TiCl$_4$) | 5% |
| Nitrogen | 25% |
| Pressure - atmospheric | |
| Feed rate | 100 NL per minute |
| Coating time | 60 minutes |
| Step B: Composition of gaseous mixture by volume: | |
| Hydrogen | 90% |
| Aluminium chloride (AlCl$_3$) | 4% |
| Carbon dioxide | 6% |
| Pressure | 50 torr |
| Feed rate | 50 NL per minute |
| Coating time | 75 minutes |
| Step C: Composition of gaseous mixture by volume: | |
| Hydrogen | 70% |
| TiCl$_4$ | 5% |
| Nitrogen | 25% |
| Pressure | 50 torr |
| Feed rate | 100 NL per minute |
| Coating time | 60 minutes |
| Step D: Composition of gaseous mixture by volume: | |
| Hydrogen | 79% |
| TiCl$_4$ | 5% |
| Methane | 3.5% |
| Nitrogen | 12.5% |
| Pressure | 50 torr |

| -continued | |
|---|---|
| Feed rate | 90 NL per minute |
| Coating time | 25 minutes |
| Step E Composition of gaseous mixture by volume: | |
| Hydrogen | 88% |
| TiCl$_4$ | 5% |
| Methane | 7% |
| Pressure | 50 torr |
| Feed rate | 80 NL |
| Coating time | 120 minutes |
| Step F Composition of gaseous mixture by volume: | |
| Hydrogen | 90% |
| AlCl$_3$ | 4% |
| Carbon dioxide | 6% |
| Pressure | 100 torr |
| Feed rate | 70 NL per minute |
| Coating time | 180 minutes |

The furnace was then allowed to cool down to ambient temperature and the pressure inside the furnace was equalized with the atmospheric pressure.

There were obtained sintered hard metal inserts coated with six thin layers in the following sequence, starting from the substrate outwards:

(1) A first, innermost layer of titanium carbonitride TiC passing gradually to titanium nitride TiN, owing to diffusion of carbon from the substrate into the TiN layer. Thickness: 1.5–2μ.

(2) A second layer of aluminium oxide Al$_2$O$_3$ having a thickness of 1–1.5μ.

(3) A third layer of titanium nitride TiN having a thickness of 2–2.5μ.

(4) A fourth layer of titanium carbonitride TiCN having a thickness of 1–1.5μ.

(5) A fifth layer of titanium carbide TiC having a thickness of 3.5–4μ.

(6) A sixth, outermost layer of aluminium oxide having a thickness of 2–2.5μ.

EXAMPLE 2

Sintered carbide cutting inserts of the same type as used in Example 1 were placed in the furnace described in Example 1 which was heated to 1027° C. Various mixtures of gases were introduced into the furnace consecutively under the conditions specified, as follows:

| Step A Composition of gaseous mixture by volume: | |
|---|---|
| Hydrogen | 76% |
| AlCl$_3$ | 4% |
| Nitrogen | 20% |
| Pressure | 200 torr |
| Feed rate | 60 NL per minute |
| Coating time | 60 minutes |
| Step B Composition of gaseous mixture by volume: | |
| Hydrogen | 90% |
| AlCl$_3$ | 4% |
| Carbon dioxide | 6% |
| Pressure | 50 torr |
| Feed rate | 50 NL per minute |
| Coating time | 75 minutes |
| Step C Composition of gaseous mixture by volume: | |
| Hydrogen | 70% |
| TiCl$_4$ | 5% |
| Nitrogen | 25% |
| Pressure | 50 torr |
| Feed rate | 100 NL per minute |
| Coating time | 60 minutes |
| Step D Composition of gaseous mixture by volume: | |
| Hydrogen | 79% |
| TiCl$_4$ | 5% |
| Methane | 3.5% |
| Nitrogen | 12.5% |
| Pressure | 50 torr |

| -continued | |
|---|---|
| Feed rate | 90 NL per minute |
| Coating time | 25 minutes |

TABLE I

| Test No. | Sequence of coating layers Inner → outer | Tool life in min. in machining of steel at speeds of | | Tool life in min. in machining cast iron at speeds of | |
|---|---|---|---|---|---|
| | | 230 $\frac{m}{min}$ | 350 $\frac{m}{min}$ | 130 $\frac{m}{min}$ | 200 $\frac{m}{min}$ |
| 1 | 5μ Al$_2$O$_3$ | 13 | 6 | 30 | 10 |
| 2 | 6μ TiC + 2μ Al$_2$O$_3$ | 16 | 3.5 | 20 | 6 |
| 3 | 0.35μ Al$_2$O$_3$ + 2μ TiN + 1μ TiCN + 4μ TiC + 2μ Al$_2$O$_3$ | 23 | 8 | 30 | 12 |
| 4 | 1μ TiCN + 1μ Al$_2$O$_3$ + 2μ TiN + 1μ TiCN + 4μ TiC + 2μ Al$_2$O$_3$ | 30 | 11 | 39 | 16 |
| 5 | 1μ AlN + 1μ Al$_2$O$_3$ + 2μ TiN + 1μ TiCN + 4μ TiC + 2μ Al$_2$O$_3$ | 25 | 9 | 36 | 14 |

| Step E Composition of gaseous mixture by volume: | |
|---|---|
| Hydrogen | 88% |
| TiCl$_4$ | 5% |
| Methane | 7% |
| Pressure | 50 torr |
| Feed rate | 80 NL per minute |
| Coating time | 120 minutes |
| Step F Composition of gaseous mixture by volume: | |
| Hydrogen | 90% |
| AlCl$_3$ | 4% |
| Carbon dioxide | 6% |
| Pressure | 100 torr |
| Feed rate | 70 NL per minute |
| Coating time | 180 minutes |

The furnace was allowed to reach ambient temperature and pressure.

There were obtained sintered hard metal cutting inserts coated with six thin layers in the following sequence, starting from the substrate outwards:

(1) A first, innermost layer of aluminium nitride AlN having a thickness of 1–1.5μ.

(2) A second layer of alumina Al$_2$O$_3$ having a thickness of 1–1.5μ.

(3) A third layer of titanium nitride TiN having a thickness of 2–2.5μ.

(4) A fourth layer of titanium carbonitride TiCN having a thickness of 1–1.5μ.

(5) A fifth layer of titanium carbide TiC having a thickness of 3.5–4μ.

(6) A sixth, outermost layer of alumina Al$_2$O$_3$ having a thickness of 2–2.5μ.

EXAMPLE 3

The metal cutting performance of coated cutting inserts prepared in accordance with Examples 1 and 2 were tested on carbon steel and on cast iron and compared with the performance of conventional, commercially available coated cutting inserts, by means of the following tests:

1. Machining test on steel

This test was performed on carbon steel AISI 1050 at speeds of 230 m/min and 350 m/min, at a uniform feed of 0.25 mm per revolution and a depth of cut of 2.5 mm. The cutting inserts were of the type TNMG 432 and the tool life was tested up to a wear of $V_b$=0.25 mm.

2. Machining tests on cast iron

The test was performed on grey cast iron at speeds of 130 m/min and 200 m/min at a uniform speed of 0.25 m/min and a cut depth of 2.5 mm. The cutting inserts were of the type TNMA 432 and the tool life was tested up to a wear of $V_b$=0.25 mm.

The results of the performance tests 1 and 2 above are shown in the following table I.

These results show that sintered carbide inserts coated in accordance with the present invention which were used in tests Nos. 5 and 6 exhibit longer tool life at all the machining speeds tested on both steel and cast iron. The increase in tool life is especially pronounced at the higher speeds of 350 m/min. with steel and 200 m/min. with cast iron.

I claim:

1. A sintered hard metal product consisting of a cemented metal carbide substrate and a thin wear-resistant surface coating comprising a plurality of coating layers of different compositions applied onto at least a part of the surface of said substrate and on top of eacch other by chemical vapour deposition, characterized in that said coating layers include:

an innermost layer applied directly onto said substrate and consisting of at least one member selected from nitrides and carbonitrides of Ti, Zr, Hf, V, Nb, Ta, Al and Si;

a second layer applied directly on said innermost layer, consisting essentially of aluminum oxide and having a thickness of about 1 to about 3μ;

a third layer composed of one or more sublayers of titanium carbide, titanium nitride and titanium carbonitride, applied on top of said aluminium oxide layer; and a further outermost layer consisting essentially of aluminium oxide and having a thickness of from about 0.4 to about 20 microns.

2. A product according to claim 1, wherein said innermost layer bonded directly to said substrate consists entirely or partially of titanium nitride.

3. A product according to claim 1, in the form of a disposable cutting insert for use in the machining of metals and other materials.

4. A product according to claim 1, in which the total thickness of the coating is less than 20 microns.

5. A sintered hard metal product consisting of a cemented metal carbide substrate and a thin wear-resistant surface coating comprising a plurality of coating layers of different compositions applied onto at least a part of the surface of said substrate and on top of each other by chemical vapour deposition, characterized in that said coating layers include:

a first innermost layer applied directly onto said substrate and consisting essentially of aluminum nitride;

a second layer applied directly on said innermost layer, consisting essentially of aluminum oxide and having a thickness of about 1 to about 3μ;

a third layer compound of one or more sublayers of titanium carbide, titanium nitride and titanium carbonitride, applied on top of said aluminum oxide layer; and a fourth, outermost layer consisting essentially of aluminum oxide and having a thickness of about 0.4 to about 20 microns.

6. A product according to claim 1 or 5, wherein said third layer is composed of three sub-layers in the sequence (in a direction from the substrate outwards): titanium nitride—titanium carbonitride—titanium carbide.

* * * * *